(12) United States Patent
Furukawa et al.

(10) Patent No.: US 6,867,143 B1
(45) Date of Patent: Mar. 15, 2005

(54) METHOD FOR ETCHING A SEMICONDUCTOR SUBSTRATE USING GERMANIUM HARD MASK

(75) Inventors: Toshiharu Furukawa, Essex Junction, VT (US); Mark C. Hakey, Fairfax, VT (US); Steven J. Holmes, Milton, VT (US); David V. Horak, Essex Junction, VT (US); William H-L. Ma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/599,783

(22) Filed: Jun. 22, 2000

(51) Int. Cl.[7] .............................................. H01L 21/302
(52) U.S. Cl. ...................... 438/704; 438/717; 438/723; 438/724
(58) Field of Search ................................ 438/717, 719, 438/734, 736, 738, 942, 945, 950, 951, 689, 704, 723, 724, 700, 424, 720, 752, 933, 400, 418, 423, 510, 618, 620, 636, 637, 638, 701, 703

(56) References Cited

U.S. PATENT DOCUMENTS

| | | | |
|---|---|---|---|
| 3,830,686 A | | 8/1974 | Lehrer ......................... 95/1 R |
| 5,354,417 A | | 10/1994 | Cheung et al. ............. 156/643 |
| 5,413,884 A | * | 5/1995 | Koch et al. ..................... 430/5 |
| 5,413,966 A | | 5/1995 | Schoenborn ................ 431/225 |
| 5,445,710 A | | 8/1995 | Hori et al. ............... 156/643.1 |
| 5,750,442 A | * | 5/1998 | Juengling ................... 438/761 |
| 5,783,036 A | | 7/1998 | Shoji ....................... 156/643.1 |
| 5,928,965 A | * | 7/1999 | Shoji et al. .................. 438/719 |
| 6,060,380 A | * | 5/2000 | Subramanian et al. ....... 438/618 |
| 6,074,930 A | * | 6/2000 | Cho et al. .................... 438/424 |
| 6,121,150 A | * | 9/2000 | Avanzino et al. ........... 438/692 |
| 6,210,988 B1 | * | 4/2001 | Howe et al. ................... 438/50 |
| 6,316,167 B1 | * | 11/2001 | Angelopoulos et al. ..... 430/313 |
| 6,339,017 B1 | * | 1/2002 | Yu .............................. 438/585 |
| 2002/0066531 A1 | * | 6/2002 | Ke et al. .................. 156/345.1 |

OTHER PUBLICATIONS

Wayne M. Moreau, "Semiconductor Lithography Principles, Practices, and Materials", Microdevices Physics and Fabrication Technologies, 1988, pp. 731–732 and 769–770.

* cited by examiner

Primary Examiner—George Fourson
Assistant Examiner—Julio J. Maldonado
(74) Attorney, Agent, or Firm—Schmeiser, Olsen & Watts; William D. Sabo (57) ABSTRACT

An etching process using germanium hard mask (25) includes forming a dielectric layer (15) over a major surface (11) of a semiconductor substrate (10) and depositing a metallic germanium layer (22) over the dielectric layer (15). The metallic germanium layer (22) is patterned through a photo resist (24) to form the germanium hard mask (25). The dielectric layer (15) is selectively etched through the germanium hard mask (25) to form a dielectric hard mask (35), through which the semiconductor substrate (10) is subsequently etched. After forming the dielectric hard mask (35), the germanium hard mask (25) is stripped away by oxidizing the metallic germanium hard mask (25) to transform it into a layer (27) of germanium oxide and rinsing the semiconductor substrate (10) in water to remove the germanium oxide layer (27). Preferably, the germanium hard mask (25) is removed before etching the semiconductor substrate (10).

27 Claims, 8 Drawing Sheets

METHOD FOR ETCHING A SEMICONDUCTOR SUBSTRATE USING GERMANIUM HARD MASK

FIELD OF THE INVENTION

The present invention relates, in general, to semiconductor device fabrication and, more particularly, to etching processes used in the fabrication of semiconductor devices.

BACKGROUND OF THE INVENTION

Etching is widely used in the fabrication of semiconductor devices. A process for etching a pattern, e.g., a trench, in a semiconductor substrate usually starts with forming a mask on the substrate. The substrate is then etched through the mask, which defines the pattern etched in the substrate. Photo resist is typically used for forming the mask. In some processes, e.g., deep trench etching, the etch selectivity to the photo resist material is insufficient, and the etching process depletes the photo resist mask and damages the underlying substrate.

In such etching processes, a dielectric hard mask, e.g., a thick silicon dioxide or silicon nitride hard mask, can be used to effectively protect the underlying substrate. Patterning a thick dielectric hard mask requires a thick photo resist mask. However, forming small patterns in a thick photo resist mask is difficult because of the shrinking photolithography depth of focus. Thus, such etching processes are not suitable for fabricating high density and high performance semiconductor devices. In addition, silicon dioxide and silicon nitride are commonly used to form dielectric structures over a semiconductor substrate. Thus, removing the hard mask after the etching process often alters and/or damages the dielectric structures underlying the hard mask. This may adversely affect the performance, characteristics, and reliability of the semiconductor devices fabricated on the substrate. The dielectric hard mask can also be patterned using a silicon mask deposited thereon. However, the removal of the silicon mask often alters and damages the underlying semiconductor substrate, thereby adversely affecting the performance of the semiconductor devices fabricated thereon.

Accordingly, there exists a need for a process for etching a semiconductor substrate using a hard mask that does not adversely affect the performance, characteristics, and reliability of the semiconductor devices fabricated on the semiconductor substrate. More particularly, it is desirable to be able to remove the hard mask without affecting the underlying material on the semiconductor substrate. It is also desirable for the etching process to be simple and cost efficient. It would be of further advantage for the etching process to be compatible with existing semiconductor device fabrication processes and suitable of fabricating high performance semiconductor devices.

SUMMARY OF THE INVENTION

A general advantage of the present invention is providing a process for etching a semiconductor substrate using a hard mask that does not adversely affect the performance, characteristics, and reliability of the semiconductor devices fabricated on the semiconductor substrate. A specific advantage is that the process of removing the hard mask does not alter and/or damage the underlying structure on the semiconductor substrate. Another specific advantage of the present invention is that the etching process is suitable for fabricating high density and high performance semiconductor devices. A further advantage is that the etching process is simple and cost efficient. An additional advantage of the present invention is that the etching process is compatible with existing semiconductor device fabrication processes.

These and other advantages of the present invention are achieved through using a germanium hard mask in an etching process. In accordance with the present invention, the etching process includes forming a dielectric layer over a major surface of a semiconductor substrate and depositing a thin layer of metallic germanium over the dielectric layer. The layer of metallic germanium is patterned to form the germanium hard mask. The dielectric layer is selectively etched through the germanium hard mask to form a pattern over the semiconductor substrate, which is etched using the dielectric layer pattern as a mask.

Patterning the thin metallic germanium layer is preferably achieved using a thin mask, e.g., a thin photo resist mask. Because of their compatibility with shallow depth of focus photolithography processes, thin photo resist masks are preferred in the fabrication of semiconductor devices with small features. Therefore, the etching process of the present invention is suitable for fabricating high density and high performance semiconductor devices. The removal of the germanium hard mask can be easily achieved by oxidizing the metallic germanium hard mask to transform it into a layer of germanium oxide and rinsing the semiconductor substrate in water to remove the germanium oxide layer. Germanium oxidation and water rinse have minimum effects on the semiconductor substrate. Therefore, the etching process of the present invention does not adversely affect the performance, characteristics, and reliability of the semiconductor devices fabricated on the semiconductor substrate. In a preferred embodiment, the germanium hard mask is removed before etching the semiconductor substrate to further protect the semiconductor devices fabricated thereon from any possible adverse effect.

It should be noted that the figures are merely schematic representations, which are not intended to portray specific parameters of the present invention. The figures should not be considered as limiting the scope of the present invention. In addition, the figures are not drawn to scale. Elements having similar functions are labeled using the same reference numerals in the figures.

DETAILED DESCRIPTION OF THE PREFERRED EMBODIMENTS

Generally, the present invention provides an etching process using a germanium hard mask. The germanium hard mask is formed by patterning a metallic germanium layer deposited over a dielectric layer disposed over a semiconductor substrate. Through the germanium hard mask, the dielectric layer is selectively etched to form a pattern over the semiconductor substrate, which is etched using the dielectric layer pattern as a mask. The patterning of the metallic germanium layer is preferably achieved using a thin mask, e.g., a thin photo resist mask. The germanium hard mask is stripped away through germanium oxidation and water rinse, both of which have minimum effects on the semiconductor substrate. In a preferred embodiment, the germanium hard mask is oxidized and rinsed away before etching the semiconductor substrate.

Figure 1:
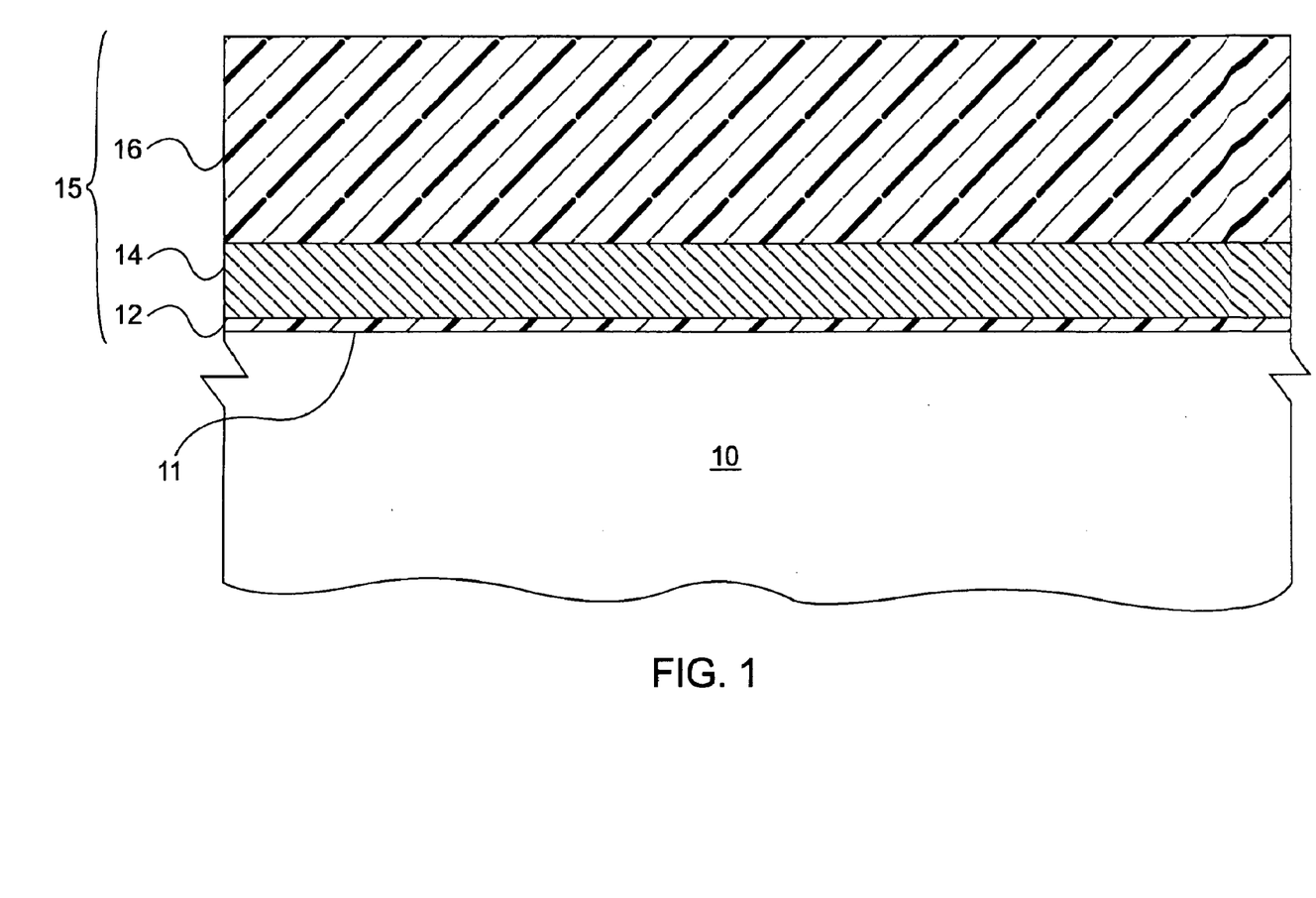
FIGS. 1–6 are schematic cross sectional views of a semiconductor substrate at various stages of an etching process in accordance with the present invention.

FIG. 1 is a schematic cross sectional view of a semiconductor substrate 10 at an early stage of an etching process in accordance with the present invention. Typically, semiconductor substrate 10 shown in FIG. 1 is a part of a semiconductor wafer. By way of example, semiconductor substrate 10 is a bulk silicon substrate. However, it should be noted that the etching process of the present invention is also applicable in etching other types of substrates such as, for example, silicon semiconductor on insulator (SOI) substrates, silicon carbide substrates, gallium arsenide (GaAs) substrates, silicon germanium substrates, ceramic substrates, etc. Substrate 10 has a major surface 11. A layer 12 of silicon dioxide having a thickness between approximately 5 nanometers (nm) and approximately 30 nm is disposed on major surface 11 of substrate 10. Layer 12 serves to protect major surface 11 of substrate 10 in a process of fabricating semiconductor devices (not shown) on substrate 10 and is also referred to as a pad oxide layer. A silicon nitride layer 14 having a thickness between approximately 50 nm and approximately 300 nm and a silicon dioxide layer 16 having a thickness between approximately 800 nm and approximately 3000 nm are disposed over layer 12 of pad oxide. Silicon dioxide layer 16 is also referred to as a mask oxide layer. Pad oxide layer 12, silicon nitride layer 14, and silicon dioxide layer 16 are also referred to as dielectric layers. Techniques for forming dielectric layers 12, 14, and 16 include oxidation, deposition, etc., which are well known to those skilled in the art. Dielectric layers 12, 14, and 16 form a dielectric stack 15 over major surface 11 of substrate 10. It should be noted that dielectric stack 15 is not limited to including three dielectric layers 12, 14, and 16 as shown in FIG. 1. In accordance with the present invention, dielectric stack 15 can includes any number of dielectric layers, e.g., one, two, four, five, etc. Further, the thickness of each layer in dielectric stack 15 is not limited to those described above. It can vary to optimize the fabrication process and devices performance.

Figure 2:
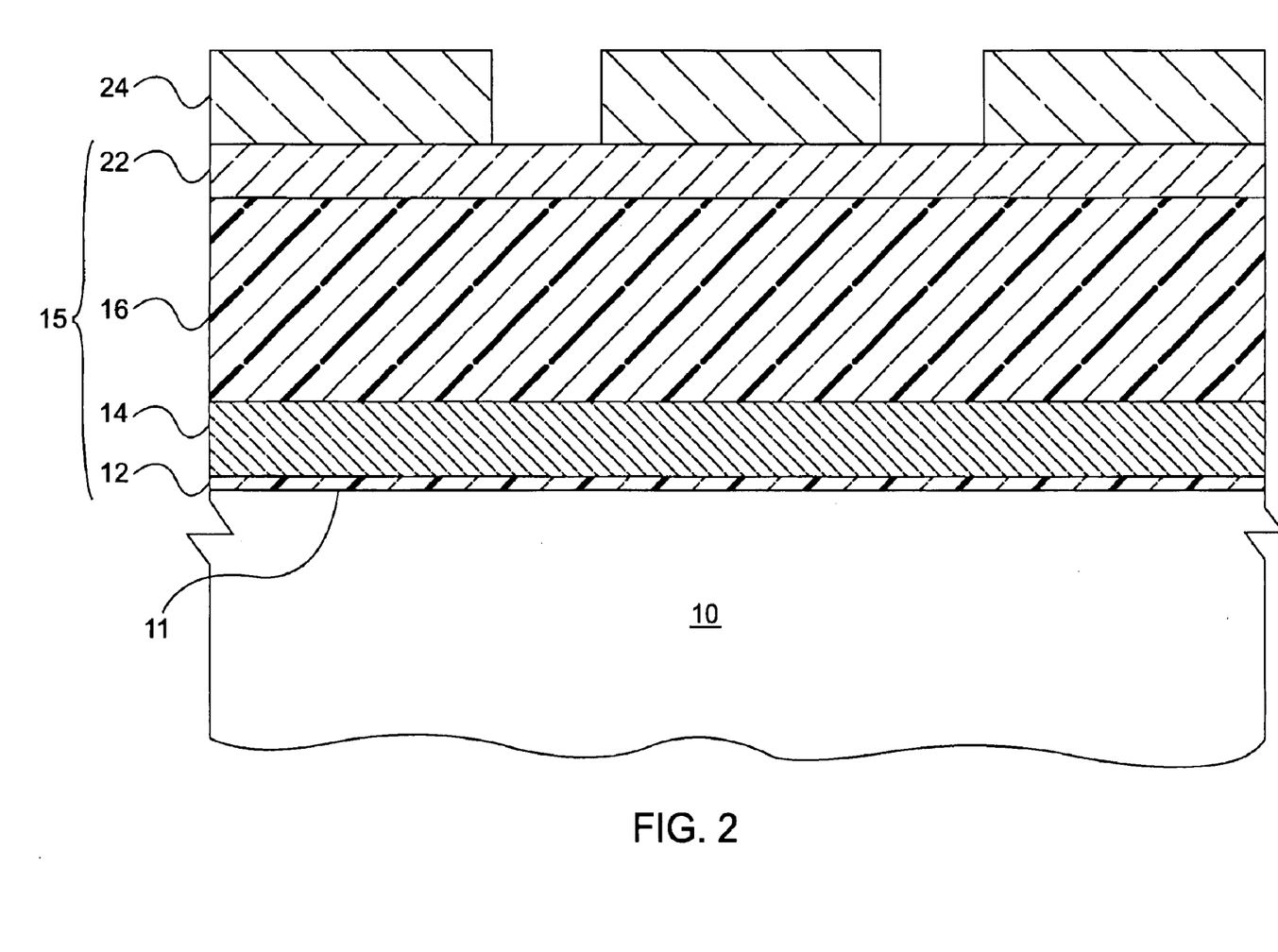

Referring now to FIG. 2, a layer 22 of metallic germanium is deposited over dielectric stack 15. By way of example, layer 22 of metallic germanium has a thickness between approximately 40 nm and approximately 500 nm and is deposited over dielectric stack 15 in a chemical vapor deposition process. A photo resist layer 24 is deposited over metallic germanium layer 22. Using exposing and developing techniques known in the art, photo resist layer 24 is patterned to form a photolithography image over metallic germanium layer 24. In other words, a photo resist photolithography mask is formed over layer 22 of metallic germanium.

Figure 3:
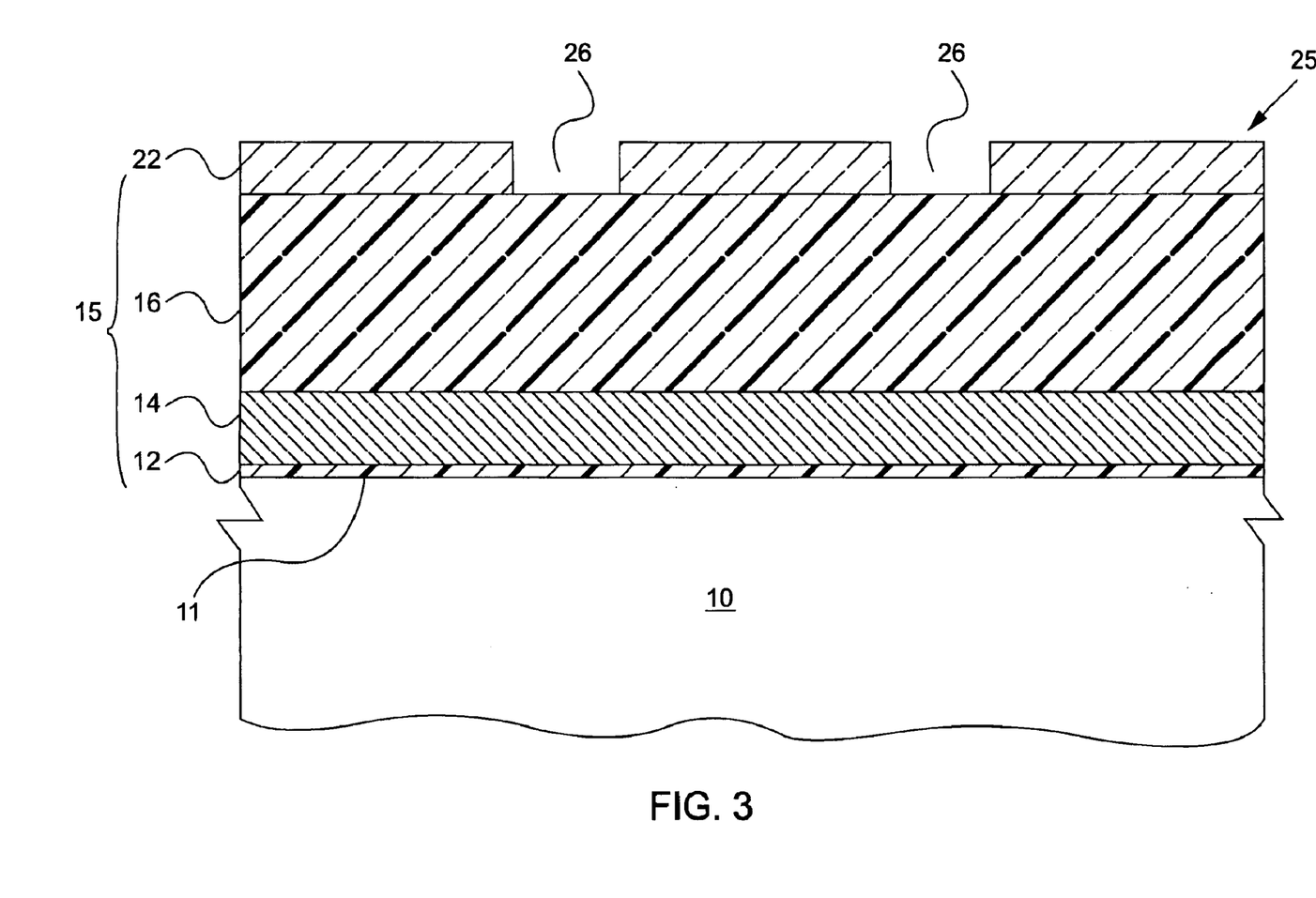

Next, metallic germanium layer 22 is patterned by etching through the photolithography image formed by photo resist layer 24. A reactive ion etching (RIE) process is preferably used to etch metallic germanium layer 22. Other etching process having a high etch selectivity between metallic germanium and photo resist can also be used to etch metallic germanium layer 22 through the mask formed by photo resist layer 24. Because of high the etch selectivity of metallic germanium relative to photo resist, photo resist layer 24 can be a thin layer of photo resist material. The thickness of photo resist layer 24 can further reduced by using a thin layer 22 of metallic germanium, thereby shortening the metallic germanium etching process. A thin photo resist mask is compatible with a shallow depth of focus photolithography processes, and therefore is preferred in the fabrication of semiconductor devices with small features. After etching layer 22 of metallic germanium, photo resist layer 24 is stripped away using techniques known in the art. The remaining germanium serves as a metallic germanium hard mask 25 over of dielectric stack 15 as shown in FIG. 3. Germanium hard mask 25 has openings, e.g., openings 26 shown in FIG. 3, through which dielectric stack 15 is selectively etched in a subsequent step of the etching process.

Figure 4:
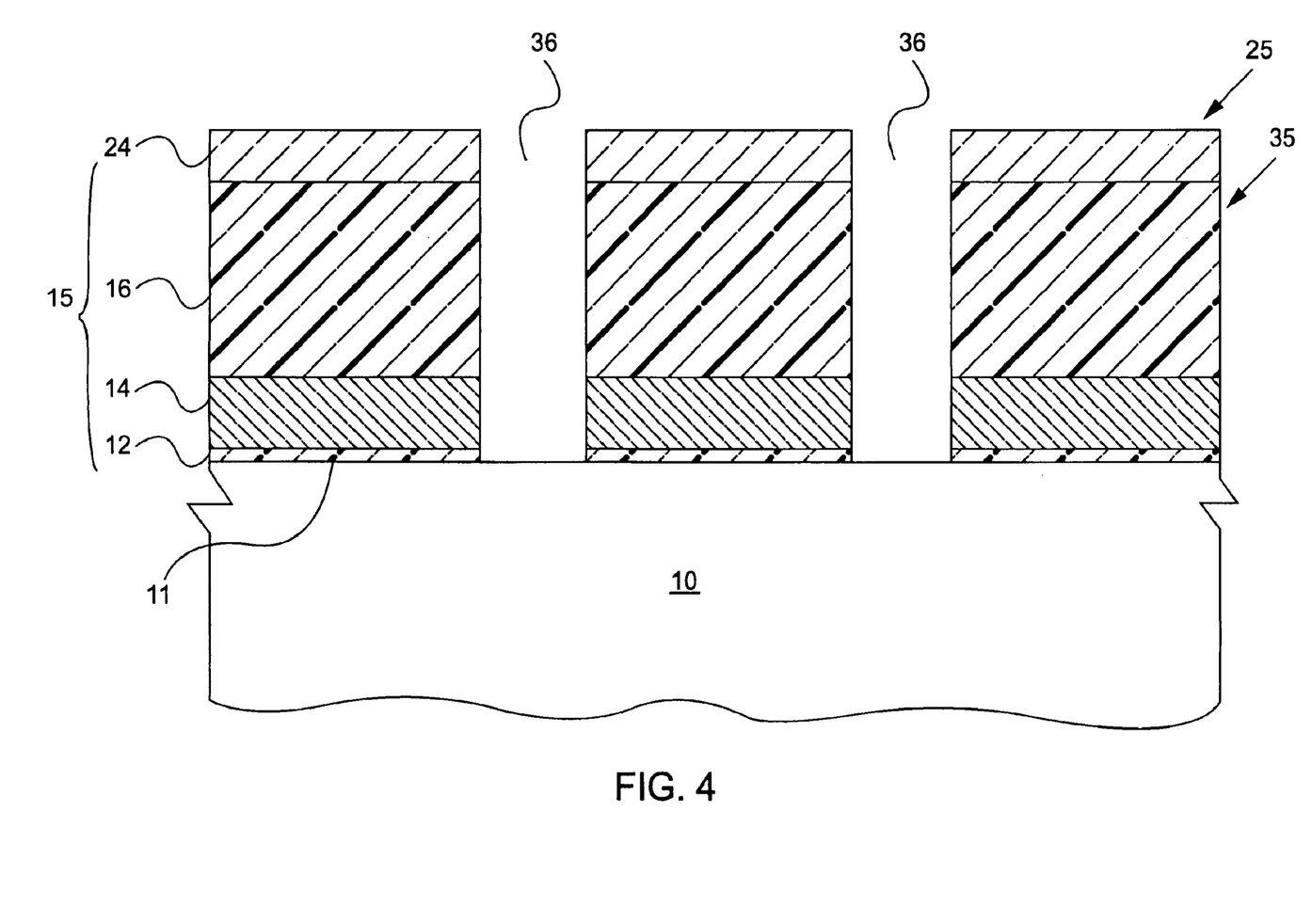

Referring now to FIG. 4, silicon dioxide layer 16, silicon nitride layer 14, and pad oxide layer 12 in dielectric stack 15 are etched through germanium hard mask 25. By way of example, an RIE process is used to etch dielectric stack 15. It should be noted that dielectric layers 16, 14, and 12 in dielectric stack 15 can be etched either in a single RIE step or in several successive RIE steps, one step for etching each of dielectric layers 16, 14, and 12. The RIE process is preferably highly selective to germanium hard mask 25 so that germanium hard mask 25 will not be depleted during the etching process. After etching, dielectric stack 15 forms a dielectric hard mask 35 over major surface 11 of substrate 10. Portions of major surface 11 of substrate 10 are exposed through openings 36 in dielectric hard mask 35.

Figure 5:
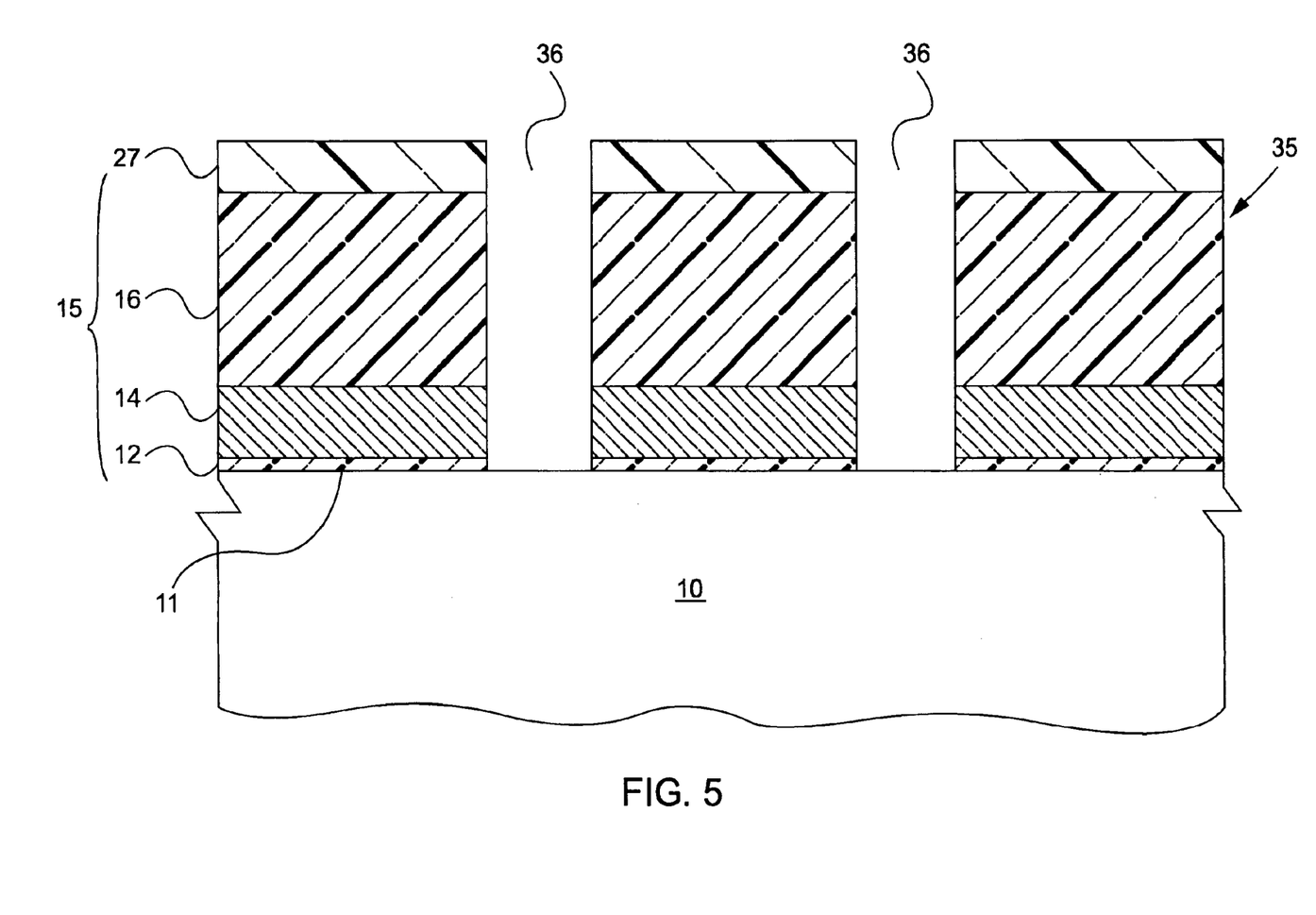

Metallic germanium hard mask 25 is preferably stripped away after forming dielectric hard mask 35. In a preferred embodiment, layer 22 of metallic germanium is oxidized and transformed into a layer 27 of germanium oxide as shown in FIG. 5. The oxidation of metallic germanium layer 22 can be achieved by placing substrate 10 in an environment of elevated temperature with ambient oxygen. In a preferred embodiment, the germanium oxidation is achieved in an anodic oxidation process, in which an electric bias is applied on metallic germanium layer 22. The time duration of the anodic oxidation process depends on the thickness of metallic germanium layer 22, the applied bias, and the temperature of substrate 10 during the oxidation process. For example, in one anodic oxidation process, a bias of approximately fifty volts is applied to metallic germanium layer 22 and semiconductor substrate 10 is placed at a temperature between approximately 500 degrees Celsius (° C.) and approximately 600° C. The oxidation process lasts between approximately fifteen minutes and approximately 60 minutes.

Figure 6:
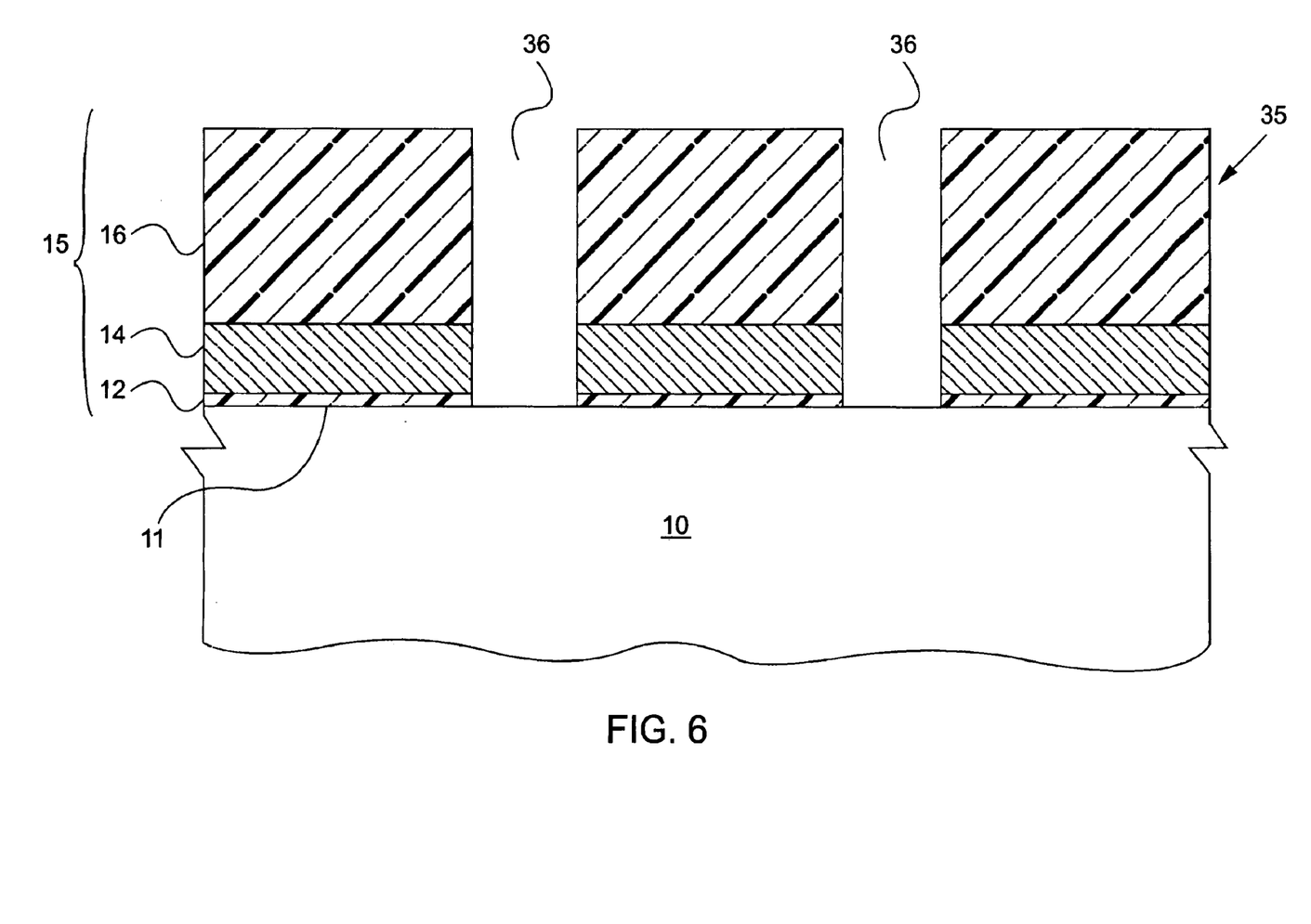
Figure 7:
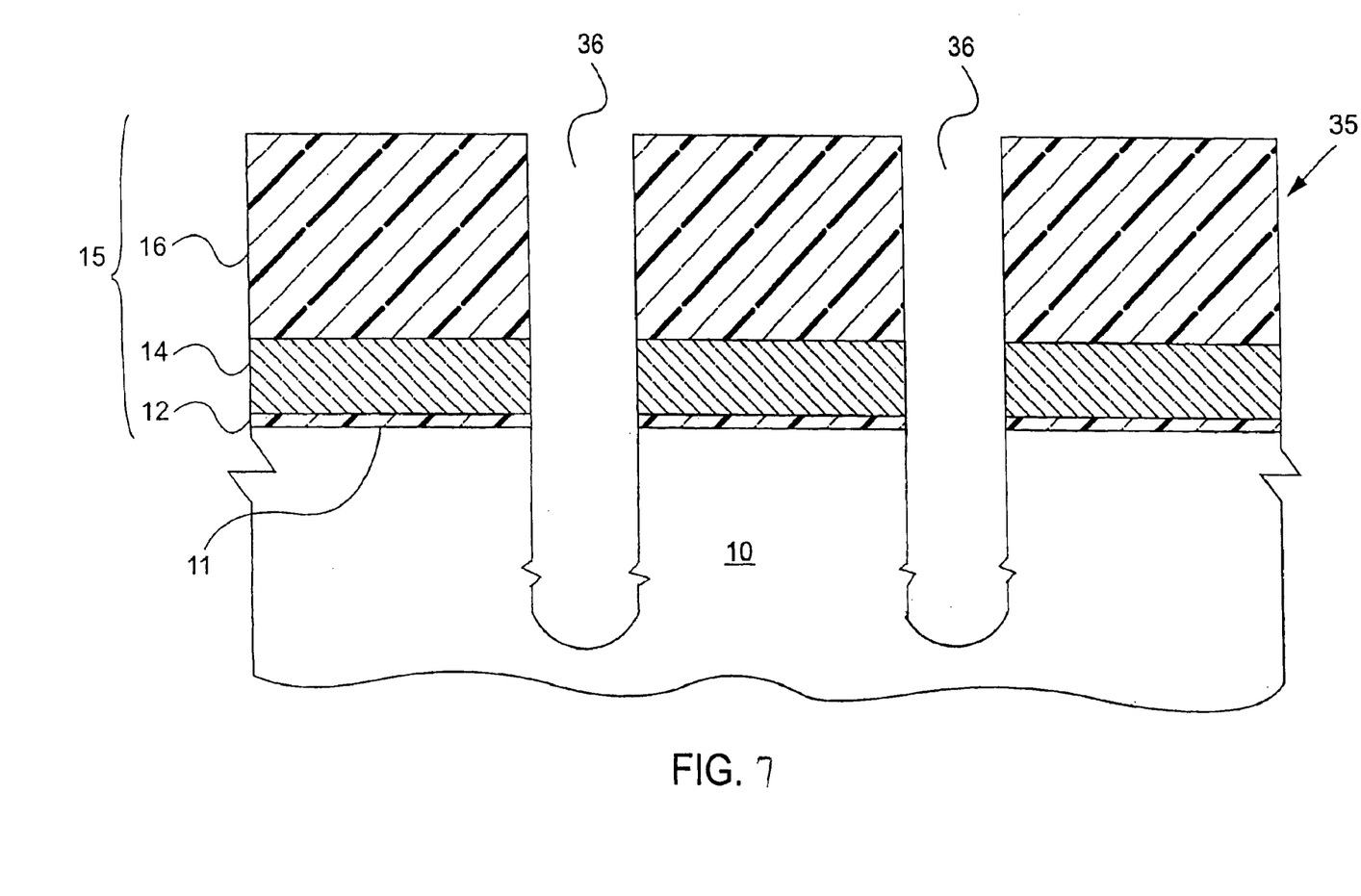
FIG. 7 depicts FIG. 6 after portions of the substrate in FIG. 6 have been etched, in accordance with the present invention.
Figure 8:
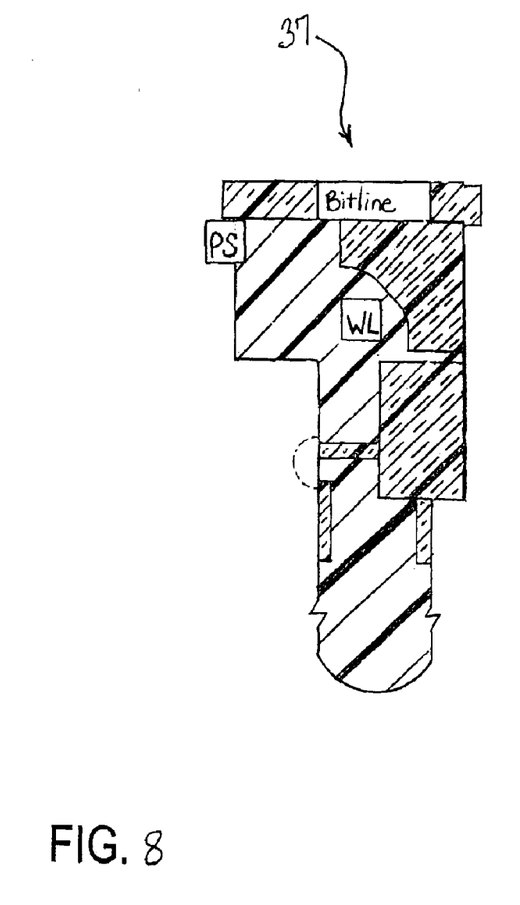
FIG. 8 depicts a semiconductor device that may be formed on the substrate of FIG. 7, in accordance with the present invention.

After oxidation, germanium oxide layer 27 can be removed or stripped from substrate 10 by rinsing substrate 10 or the semiconductor wafer that includes substrate 10 with water. After germanium oxide layer 27 is stripped from the top of dielectric stack 15 over substrate 10, dielectric stack 15 serves as dielectric hard mask 35 (shown in FIG. 6) for subsequently etching semiconductor substrate 10, as shown in FIG. 7. To form semiconductor devices 37 (shown in FIG. 8) such as, for example, field effect transistors, bipolar transistors, etc., on semiconductor substrate 10, other processing steps are performed after etching semiconductor substrate 10 through dielectric hard mask 35. These steps include, but are not limited to, forming doped regions in semiconductor substrate 10 through implantation and/or diffusion; forming dielectric structures over semiconductor substrate 10 through oxidation, deposition, and etching; and forming conductive structures over semiconductor substrate 10. These and other process steps for forming semiconductor devices on substrate 10 are known to those skilled in the art.

Using dielectric hard mask 35 in etching semiconductor substrate 10 is compatible with forming deep trenches in semiconductor substrate 10. More particularly in a deep trench etching process, a thick dielectric hard mask like dielectric hard mask 35 shown in FIG. 6 is not prone to be depleted and, therefore, effectively protects the underlying surface of the substrate like major surface 11 of semiconductor substrate 10. In accordance with the present invention, dielectric hard mask 35 is formed by selectively etching dielectric stack 15 through thin metallic germanium hard mask 25 (shown in FIG. 4). This is achievable due to the high etch selectivity of metallic germanium with respect to dielectric materials such as silicon dioxide and silicon nitride. A thin germanium hard mask can be formed using a thin photo resist mask, thereby making the etching process of the present invention suitable for shallow focal depth photolithography processes.

A preferred way of removing metallic germanium hard mask 25 is converting metallic germanium into germanium oxide and rising away the germanium oxide with water. Germanium oxidation and water rinse has minimum adverse effects on the structures formed on semiconductor substrate 10. In accordance with the present invention, the removal of germanium hard mask 25 can be performed either before etching substrate 10 through dielectric hard mask 35 or at a later stage in the semiconductor device fabrication process. In a preferred embodiment, germanium hard mask 25 is removed after etching dielectric stack 15 to form dielectric hard mask 35 and before etching substrate 10 through dielectric hard mask 35. This approach further minimizes any possible effect of the etching process on the semiconductor devices formed on substrate 10.

By now it should be appreciated that a process for etching a semiconductor substrate has been provided. In accordance with the present invention, the etching process includes depositing a thin layer of metallic germanium on a dielectric layer disposed over a major surface of the semiconductor substrate. The metallic germanium layer is patterned to form a germanium hard mask. The dielectric layer is selectively etched through the germanium hard mask to form a dielectric hard mask over the semiconductor substrate, which is subsequently etched through the dielectric hard mask. The germanium hard mask can be easily removed or stripped away by oxidizing the metallic germanium hard mask to transform it into a layer of germanium oxide and rinsing the semiconductor substrate in water. Thus, the removal process of the germanium hard mask has minimum effects on the semiconductor substrate. In a preferred embodiment, the germanium hard mask is removed before etching the semiconductor substrate to further protect the semiconductor devices to be fabricated thereon from any possible adverse effect. The thin metallic germanium layer can be patterned using a thin mask, e.g., a thin photo resist mask, which is preferred in the fabrication of semiconductor devices with small features. Therefore, the etching process of the present invention is suitable for fabricating high density and high performance semiconductor devices. In addition, the etching process of the present invention is that the etching process is simple, cost efficient, and compatible with existing semiconductor device fabrication processes.

What is claimed is:
1. A method for etching a semiconductor substrate mask the semiconductor substrate having at least one dielectric layer over a major surface thereof, the method comprising the steps of:
   a) depositing a layer of metallic germanium over the at least one dielectric layer;
   b) patterning the layer of metallic germanium to form a germanium hard mask, as a top most layer over the at least one dielectric layer, the patterning step comprising:
      i) depositing a photo resist layer over the layer of metallic germanium;
      ii) exposing the photo resist layer to light and developing the exposed photo resist layer to form a photolithography image;
      iii) etching the layer of metallic germanium through the photolithography image; and
      iv) removing the photolithography image prior to selectively etching the at least one dielectric layer through the germanium hard mask;
   c) selectively etching the at least one dielectric layer through the germanium hard mask with the germanium hard mask as a top most layer to form an opening in the at least one dielectric layer;
   d) selectively etching the semiconductor substrate through the opening in the at least one dielectric layer; and
   e) removing the layer of metallic germanium after performing the step of selectively etching the at least one dielectric layer and before performing the step of selectively etching the semiconductor substrate.

2. The method as claimed in claim 1, the step of removing the layer of germanium oxide including rinsing the semiconductor substrate in water.

3. The method as claimed in claim 1, the step of removing the layer of metallic germanium including:
   oxidizing the layer of metallic germanium to form a layer of germanium oxide therefrom; and
   removing the layer of germanium oxide.

4. The method as claimed in claim 3, wherein the step of oxidizing the layer of metallic germanium includes heating the semiconductor substrate at elevated temperature in an environment of ambient oxygen such that the elevated temperature is sufficiently high to oxidize the layer of metallic germanium.

5. The method as claimed in claim 1, further comprising the step of forming the at least one dielectric layer which includes the steps of:
   forming a pad oxide layer having a thickness between approximately 5 nm and approximately 30 nm over the major surface of the semiconductor substrate;
   depositing a nitride layer having a thickness between 50 nm and approximately 300 nm over the pad oxide layer; and
   depositing a mask oxide layer having a thickness between 800 nm and approximately 3,000 nm over the nitride layer.

6. A method for fabricating a semiconductor device, comprising the steps of:
   a) depositing a metallic germanium layer on a dielectric stack, the dielectric stack having a plurality of dielectric layers disposed on a semiconductor substrate;
   b) patterning the metallic germanium layer to form a germanium hard mask as a top most layer over the dielectric stack, the patterning step comprising:
      i) depositing a photo resist layer over the metallic germanium layer;
      ii) exposing the photo resist layer to light and developing the exposed photo resist layer to form a photolithography image; and
      iii) etching the metallic germanium layer through the photolithography image;

c) removing the photolithography image prior to etching the dielectric stack through the germanium hard mask;

d) etching the dielectric stack through the germanium hard mask with the germanium hard mask as a top most layer to form a dielectric hard mask over the major surface of the semiconductor substrate;

e) etching the semiconductor substrate through the dielectric hard mask;

f) forming doped regions in the semiconductor substrate; and g) forming dielectric and conductive structures over the semiconductor substrate; and h) removing the metallic germanium layer after the step of etching the dielectric stack and before the step of etching the semiconductor substrate, wherein the step of removing the metallic germanium layer includes the steps of:

oxidizing the metallic germanium layer, and rinsing the semiconductor substrate in water after performing the step of oxidizing the metallic germanium layer.

7. The method as claimed in claim 6, wherein the step of depositing a metallic germanium layer includes depositing the metallic germanium layer having a thickness between approximately 40 nm and approximately 500 nm in a chemical vapor deposition process.

8. The method as claimed in claim 6, further comprising the step of forming the dielectric stack including the steps of:

forming a pad oxide layer having a thickness between approximately 5 nm and approximately 30 nm on the major surface of the semiconductor substrate;

depositing a nitride layer having a thickness between 50 nm and approximately 300 nm on the pad oxide layer; and depositing a mask oxide layer having a thickness between 800 nm and approximately 3000 nm on the nitride layer.

9. A method for etching a semiconductor wafer, comprising the steps of:

a) forming a germanium hard mask as a top most layer over the dielectric stack, the dielectric stack having a plurality of dielectric layers disposed on a major surface of the semiconductor wafer, the stop of forming a germanium hard mask comprising:

depositing a layer of metallic germanium having a thickness equal to or greater than approximately 40 nm over the dielectric stack, depositing a photo resist layer over the layer of metallic germanium, exposing the photo resist layer to light and developing the exposed photo resist layer to form a photolithography mask, and etching the layer of metallic germanium through the photolithography mask;

b) removing the photolithography image prior to etching the dielectric stack through the germanium hard mask;

c) etching the dielectric stack through the germanium hard mask to form a dielectric hard mask over the major surface of the semiconductor wafer; and d) etching the semiconductor wafer through the dielectric hard mask; and e) removing the germanium hard mask after etching the dielectric stack and before etching the semiconductor wafer, wherein the step of removing the germanium hard mask includes the steps of:

oxidizing the layer of metallic germanium to convert the layer of metallic germanium into a layer of germanium oxide, and removing the layer of germanium oxide.

10. The method as claimed in claim 9, wherein the step of removing the layer of germanium oxide includes rinsing the semiconductor wafer in water.

11. The method as claimed in claim 9, wherein the step of oxidizing the layer of metallic germanium includes heating the semiconductor substrate at elevated temperature in an environment of ambient oxygen such that the elevated temperature is sufficiently high to oxidize the layer of metallic germanium.

12. A method for etching a semiconductor substrate having at least one dielectric layer over a major surface thereof, the method comprising the steps of:

a) depositing a layer of germanium over the at least one dielectric layer;

b) depositing a photo resist layer over the layer of germanium;

c) exposing the photo resist layer to light and developing the exposed photo resist layer to form a photolithography image;

d) etching the layer of germanium through the photolithography image to form a germanium hard mask over the at least one dielectric layer;

e) removing the photo resist layer from over the germanium hard mask;

f) patterning the at least one dielectric layer through the germanium hard a mask to form a dielectric hard mask over the semiconductor substrate; and g) selectively etching the semiconductor substrate through the dielectric hard mask; and h) removing the germanium hard mask, comprising the steps of: oxidizing the layer of germanium to form a layer of germanium oxide therefrom, and removing the layer of germanium oxide.

13. The method as claimed in claim 12, wherein removing the layer of germanium oxide comprises rinsing the semiconductor substrate in water.

14. The method as claimed in claim 12, wherein oxidizing the layer of germanium includes heating the semiconductor substrate at elevated temperature in an environment of ambient oxygen such that the elevated temperature is sufficiently high to oxidize the layer of metallic germanium.

15. The method as claimed in claim 12, further comprising forming the at least one dielectric layer by:

forming a pad oxide layer having a thickness between approximately 5 nm and approximately 30 nm over the major surface of the semiconductor substrate;

depositing a nitride layer having a thickness between 50 nm and approximately 300 nm over the pad oxide layer; and depositing a mask oxide layer having a thickness between 800 nm and approximately 3,000 nm over the nitride layer.

16. A method for etching a semiconductor substrate having at least one dielectric layer over a major surface thereof, the method comprising the steps of:

a) depositing a layer of germanium over the at least one dielectric layer;

b) patterning the layer of germanium to form a germanium hard mask, the step further comprising:

i) depositing a photo resist layer over the layer of germanium;

ii) exposing the photo resist layer to light and developing the exposed photo resist layer to form a photolithography image;

iii) etching the layer of germanium through the photolithography image; and iv) removing the photolithography image prior to selectively etching the at least one dielectric layer through the germanium hard mask;

c) patterning the at least one dielectric layer through the germanium hard mask using a process selective to germanium to form an opening in the at least one dielectric layer; and d) selectively etching the semiconductor substrate through the opening in the at least one dielectric layer.

17. The method as claimed in claim 1, wherein oxidizing the layer of metallic germanium, includes oxidizing the layer of metallic germanium in an anodic oxidation process having a time duration, and wherein the anodic oxidation process comprises: heating the semiconductor wafer at an elevated temperature in an environment of ambient oxygen such that the elevated temperature is sufficiently high to oxidize the layer of metallic germanium; and applying an electric bias to the layer of metallic germanium.

18. The method as claimed in claim 17, wherein the time duration depends on the thickness of the layer of metallic germanium, the applied electric bias, and the elevated temperature.

19. The method as claimed in claim 1, wherein the at least one dielectric layer comprises a plurality of dielectric layers.

20. The method as claimed in claim 6, wherein oxidizing the metallic germanium layer includes heating the semiconductor substrate at elevated temperature in an environment of ambient oxygen such that the elevated temperature is sufficiently high to oxidize the layer of metallic germanium.

21. The method as claimed in claim 6, wherein oxidizing the metallic germanium layer includes oxidizing the metallic germanium layer in an anodic oxidation process having a time duration, and wherein the anodic oxidation process comprises: heating the semiconductor substrate at an elevated temperature in an environment of ambient oxygen such that the elevated temperature is sufficiently high to oxidize the layer of metallic germanium; and applying an electric bias to the metallic germanium layer.

22. The method as claimed in claim 21, wherein the time duration depends on the thickness of the metallic germanium layer, the applied electric bias, and the elevated temperature.

23. The method as claimed in claim 9, wherein oxidizing the layer of metallic germanium, includes oxidizing the layer of metallic germanium in an anodic oxidation process having a time duration, and wherein the anodic oxidation process comprises: heating the semiconductor wafer at an elevated temperature in an environment of ambient oxygen such that the elevated temperature is sufficiently high to oxidize the layer of metallic germanium; and applying an electric bias to the layer of metallic germanium.

24. The method as claimed in claim 12, wherein oxidizing the layer of germanium includes oxidizing the layer of germanium in an anodic oxidation process having a time duration, and wherein the anodic oxidation process comprises: heating the semiconductor substrate at an elevated temperature in an environment of ambient oxygen such that the elevated temperature is sufficiently high to oxidize the layer of metallic germanium; and applying an electric bias to the layer of germanium.

25. The method as claimed in claim 24, wherein the time duration depends on the thickness of the layer of germanium, the applied electric bias, and the elevated temperature.

26. The method as claimed in claim 12, wherein the at least one dielectric layer comprises a plurality of dielectric layers.

27. The method as claimed in claim 16, wherein the at least one dielectric layer comprises a plurality of dielectric layers.

* * * * *